(12) United States Patent
Nightingale et al.

(10) Patent No.: US 7,856,346 B2
(45) Date of Patent: Dec. 21, 2010

(54) EMULATING MULTIPLE BUS USED WITHIN A DATA PROCESSING SYSTEM

(75) Inventors: Andrew Mark Nightingale, Cambridge (GB); Timothy Charles Mace, Suffolk (GB)

(73) Assignee: ARM Limited, Cambridge (GB)

( * ) Notice: Subject to any disclaimer, the term of this patent is extended or adjusted under 35 U.S.C. 154(b) by 1698 days.

(21) Appl. No.: 10/142,148

(22) Filed: May 10, 2002

(65) Prior Publication Data

US 2003/0212968 A1 Nov. 13, 2003

(51) Int. Cl.
| | |
|---|---|
| G06F 19/00 | (2006.01) |
| G06F 17/50 | (2006.01) |
| G06F 9/44 | (2006.01) |
| G06F 9/455 | (2006.01) |
| G01R 27/28 | (2006.01) |
| G04F 5/00 | (2006.01) |

(52) U.S. Cl. ............................ 703/15; 703/14; 703/13; 703/21; 703/23; 703/17; 716/5; 702/117; 700/100; 700/105; 700/107; 700/108; 700/305; 700/112; 700/113

(58) Field of Classification Search ............. 703/23–28, 703/13–15, 17, 21; 710/305–317, 100, 105, 710/107, 108, 112, 113; 716/5; 702/117
See application file for complete search history.

(56) References Cited

U.S. PATENT DOCUMENTS

| | | | | |
|---|---|---|---|---|
| 5,088,033 | A * | 2/1992 | Binkley et al. ................. 703/24 |
| 5,572,734 | A * | 11/1996 | Narad et al. ................. 710/200 |
| 5,881,267 | A * | 3/1999 | Dearth et al. ................. 703/27 |
| 6,078,742 | A * | 6/2000 | Chow ........................... 703/25 |
| 6,123,735 | A * | 9/2000 | Raghavan et al. ............. 703/21 |
| 6,154,801 | A * | 11/2000 | Lowe et al. ................... 710/119 |
| 6,182,248 | B1 * | 1/2001 | Armstrong et al. ............ 714/43 |
| 6,442,514 | B1 * | 8/2002 | Le ............................... 703/21 |
| 6,678,625 | B1 * | 1/2004 | Reise et al. ................... 702/117 |
| 6,751,751 | B1 * | 6/2004 | Murray et al. ................ 714/34 |
| 6,922,666 | B2 * | 7/2005 | Noyes .......................... 703/26 |
| 2003/0110338 | A1 * | 6/2003 | Wang et al. .................. 710/305 |
| 2003/0158986 | A1 * | 8/2003 | Hong .......................... 710/113 |

OTHER PUBLICATIONS

"Multi-layer AHB: Overview." ARM Limited. Mar. 15, 2001.*
"AMBA Specification, Rev 2.0." ARM Limited. May 13, 1999. pp. 3.1-3.58, 6.1-6.38.*
Acquaviva, Andrea et al. "A Spatially-Adaptive Bus Interface for Low-Switching Communication." ISLPD '00 pp. 238-240. Copyright 2000 ACM.*
Heaton, Nick et al. "A Verification Envronment for an Embedded Processor." EE Times, Jun. 8, 2001.*

(Continued)

*Primary Examiner*—Hugh Jones
*Assistant Examiner*—Shambhavi Patel
(74) *Attorney, Agent, or Firm*—Nixon & Vanderhye P.C.

(57) ABSTRACT

A test system for data processing circuit design emulates multiple bus masters and provides an arbitration mechanism for coordinating arbitration between those bus masters in the design emulation. The shared bus being tested may be a multi-layer bus and one or more of the bus masters being emulated or bus slaves being emulated may be cut-down emulations modelling the bus interaction itself or full emulations of the intended bus master circuit or bus slave circuit including its operational data processing.

18 Claims, 6 Drawing Sheets

OTHER PUBLICATIONS

Morrison, David. "Universal Controller Ties Fate to Emulation." EE Times, Nov. 6, 2001.*

"Design for Testability: Using Emulation-Based ATE." GEOTEST Marvin Test Systems, Inc. Feb. 2002.*

Flynn, David "AMBA: Enabling Reusable On-Chip Designs" IEEE 1997.*

ARM Inc. "AMBA Specification Manual Rev. 2.0" 1999.*

Goel et al. "Formal Verification of an IBM CoreConnect Processor Local Bus Aribiter Core", 2000.*

* cited by examiner

Switch granting to automatic until this address cycle

Master hgrant leading zeroes are optional

|  |  |
|---|---|
|  | 000000000000001 |
|  | 000000000000010 |
| @3000 | 000000000000010 |
|  | 000000000000001 |
| @7000 | 000000000000001 |

FIG. 4

| Slave device register description file ID | Slave device instance name | Slave device base address | Slave device base address maximum offset |
|---|---|---|---|
| Tube | uTube | 0x20000000 | 0x0000FFFF |
| IntCntl | uIntCntl | 0x80000000 | 0x0000FFFF |
| Timers | uFRC1 | 0x84000000 | 0x00000020 |
| Timers | uFRC2 | 0x84000020 | 0x00000020 |
| RemPause | uRemPause | 0x88000000 | 0x0000FFFF |

FIG. 5

EMULATING MULTIPLE BUS USED WITHIN A DATA PROCESSING SYSTEM

BACKGROUND OF THE INVENTION

1. Field of the Invention

This invention relates to the field of data processing systems. More particularly, this invention relates to the testing of a design of a data processing circuit having a plurality of bus masters connecting via a shared bus to at least one bus slave.

2. Description of the Prior Art

As data processing circuits become more complex, this is reflected in the complexity of the bus system(s) that typically connect circuit elements. As an example, it is increasingly common to have multiple bus masters communicating with multiple bus slaves over a shared bus, which may be a multi-layer bus. When developing such designs, it is important that the designs should be thoroughly tested by way of emulation before the circuits are actually manufactured. Identifying problems during emulation is much more cost and time effective than first identifying those problems when the circuit has been physically built. In the context of the bus systems used within data processing circuits, one important aspect is to check that the bus itself is properly designed and connected to the various bus masters and slaves to permit the communication required. Another important aspect is that the various bus masters and bus slaves should be able to interact with each other and the bus in a manner whereby they can achieve the desired communication and performance whilst avoiding conflict with one another.

One approach to testing the design of bus systems is to provide separate emulations of a number of bus masters to be connected to the bus system and have those bus masters seek to drive the shared bus and communicate via the shared bus in accordance with their own scripts. This approach requires a disadvantageously large degree of engineering time and effort to undertake successfully and becomes increasingly difficult as the designs being emulated become more complex.

SUMMARY OF THE INVENTION

Viewed from one aspect, the present invention provides a method of testing a design of a data processing circuit having a plurality of bus masters connected via a shared bus to at least one bus slave, said method comprising the steps of:

emulating a bus master issuing a bus access request to make a data transfer via said shared bus to a bus slave;

detecting if another bus master being emulated has blocked access to said bus slave; and if another bus master being emulated has blocked access to said bus slave, then refusing said bus access request; or if another bus master being emulated has not blocked access to said bus slave, then granting said bus access request.

The invention recognises that a particular problem in testing designs having multiple bus masters connected via a shared bus is that the separate bus masters can inadvertently interfere with each other during their emulated operation in a manner which gives false test results, e.g. one bus master writes a particular value to a slave and then expects to read back that value at a later time but instead has its test disrupted by an intervening write made by another bus master to that same slave. In order to deal with this, the present technique provides a mechanism that coordinates the emulation of the bus masters such that a detection may be made when a bus master seeks to make a data transfer as to whether or not another bus master being emulating has previously blocked access to the bus slave in question. Providing such an automatic detection mechanism greatly simplifies the way in which the testing of the shared bus may be performed and reduces the engineering effort required in designing the testing to be performed since the bus masters being emulated are able to coordinate their action themselves.

In preferred embodiments of the invention, the bus masters being emulated are driven by a bus master script specifying data transfers to be emulated. Providing bus masters responsive to a script in this way allows the test engineer to explore various operational states in a convenient and methodical fashion as well as potentially allowing for the automatic generation of test scripts.

In the context of driving bus masters with a bus master script, preferred embodiments allow the script to specify that a bus slave is to be locked and/or released at a particular point in the script. This allows the flexibility to enable testing of what will happen when two bus masters do potentially interfere with each other as well as providing the mechanisms that prevent interference when this is not desired as part of the test itself.

In preferred embodiments, the plurality of bus masters being emulated may be driven by a concatenated bus master script with the detection mechanism for locked accesses being able to deal with an interaction between different bus masters being driven by the concatenated script.

In order to be able to test external arbitration itself, preferred embodiments of the invention provide an emulation control script that specifies emulating bus clock cycles at which an external arbiter may override the detection step and serve to grant bus access requests using external arbitration rules.

Whilst the bus masters being emulated may all be simple cut-down emulations merely serving to drive bus transfer activity in accordance with their associated script, the present technique is also useful when one or more of the bus masters connected to the shared bus under test is an emulation of the data processing circuit which will in the real physical system be connected to that shared bus with an emulation of the operational data processing by that bus master being conducted at the same time as the shared bus itself is being tested. This provides more realistic testing of a design and enables emulation of the way an operational circuit drives the shared bus and interacts with other bus masters to be tested at the design stage.

Whilst the shared bus could be a simple single layer bus, the invention is particularly well suited the emulation of more complex designs, such as multi-layer shared buses.

Viewed from another aspect, the invention provides apparatus for testing a design of a data processing circuit having a plurality of bus masters connected via a shared bus to at least one bus slave, said apparatus comprising:

an emulator operable to emulate a bus master issuing a bus access request to make a data transfer via said shared bus to a bus slave; and a detector operable to detect if another bus master being emulated has blocked access to said bus slave; wherein if another bus master being emulated has blocked access to said bus slave, then said bus access request is refused; or if another bus master being emulated has not blocked access to said bus slave, then said bus access request is granted.

BRIEF DESCRIPTION OF THE DRAWINGS

Embodiments of the invention will now be described, by way of example only, with reference to the accompanying drawings in which:

FIG. 4 schematically illustrates an input file for controlling the switching between manual and automatic arbitration within the emulation;

FIG. 5 schematically illustrates the memory map specifying slave devices to be used within the emulation;

DESCRIPTION OF THE PREFERRED EMBODIMENTS

Figure 1:
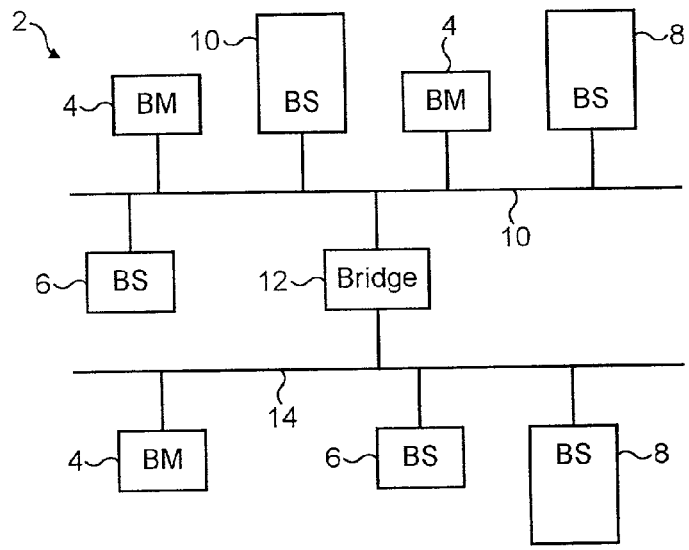
FIG. 1 schematically illustrates a data processing circuit comprising multiple bus masters and bus slaves connected via a shared multi-layer bus.

FIG. 1 schematically illustrates a data processing circuit 2 comprising multiple bus masters, bus slaves and a multi-layer shared bus. Some of the bus masters 4 are simple cut-down emulations of bus masters driven by a concatenated bus master script and serving to exercise the shared bus and test communication via that bus. Similarly, some of the bus slaves 6 are cut-down bus slaves serving to respond to data transfers driven from elsewhere in a simple fashion. Within the emulation, there are also provided emulations of operational bus masters 8 and an operational bus slave 10 that serve to emulate the actual operational data processing performed by those circuit elements in the system concerned as well as the interaction of those elements with the shared bus. The shared bus is formed of a first portion 10 linked via a bridge 12 to a second portion 14. Such multi-layer shared buses are increasingly common and require thorough design testing by emulation.

Figure 2:
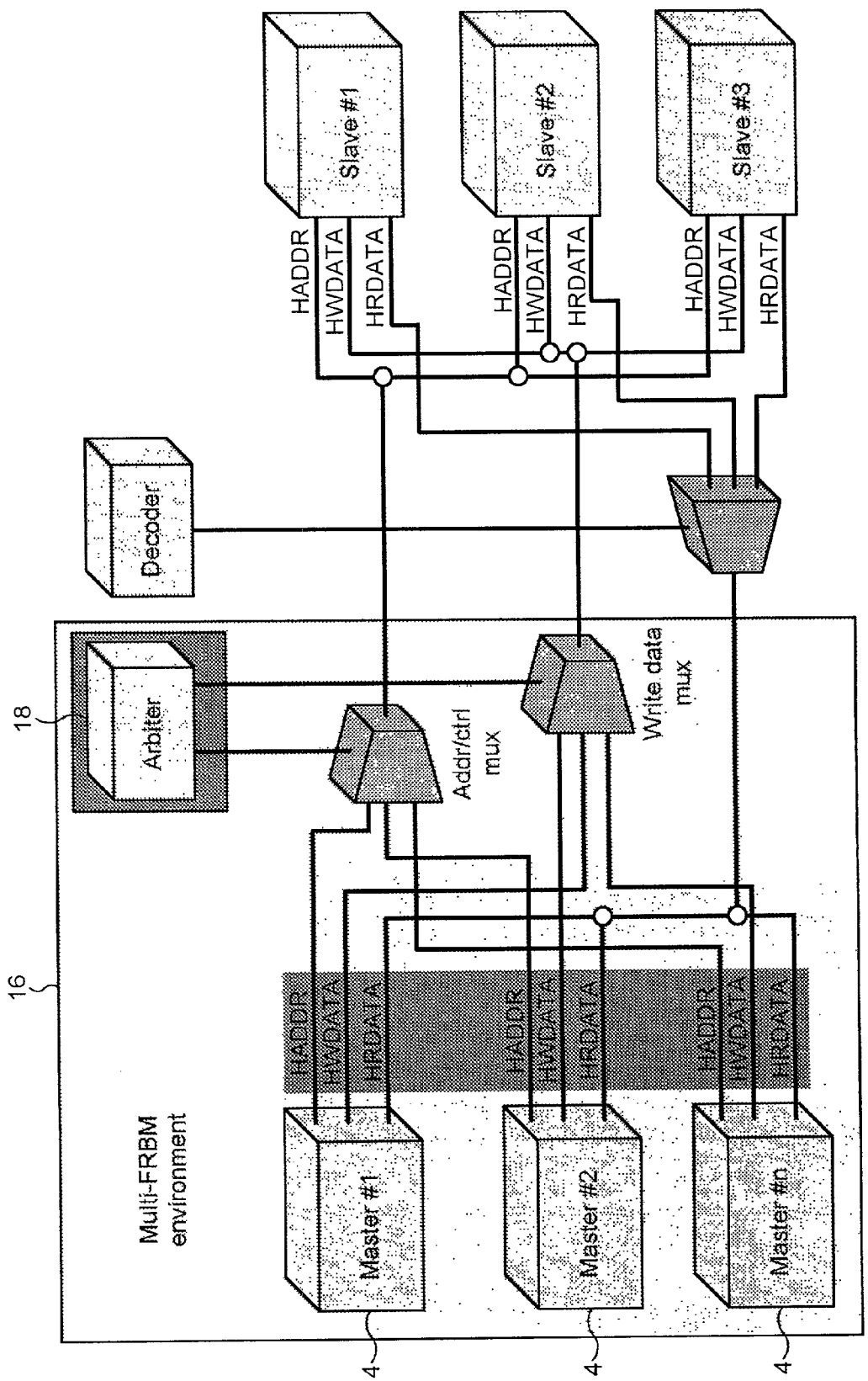
FIG. 2 schematically illustrates the emulation of multiple bus masters with their detection mechanism for detecting bus access conflicts.

FIG. 2 schematically illustrates the multiple cut-down bus master emulations 4 being provided within a single bus master emulation environment 16. Such a single bus master emulation environment 16 enables the action of the various bus master emulations 4 to be coordinated and, in particular, conflicts between the bus master emulations 4 to be detected and appropriate arbitration performed by an arbitration mechanism 18.

It will be appreciated that whilst FIG. 2 illustrates the bus master emulations 4 and the arbitration mechanism 18 as physical blocks, in the emulation environment 16 these entities are in reality simulated by computer software rather than being physically provided in themselves. The emulation and simulation environments and tools such entities are modelled are known and will not in themselves be described further herein. The arrangement of the present technique serves to improve the design testing by emulating multiple bus masters within a common framework and with a detection mechanism 18 provided to automatically detect conflicts arising between the emulated bus masters in a manner that frees the test engineer from having to deal with such conflicts, either by ensuring that they do not occur or by isolating their effects in the test results.

Figure 3:
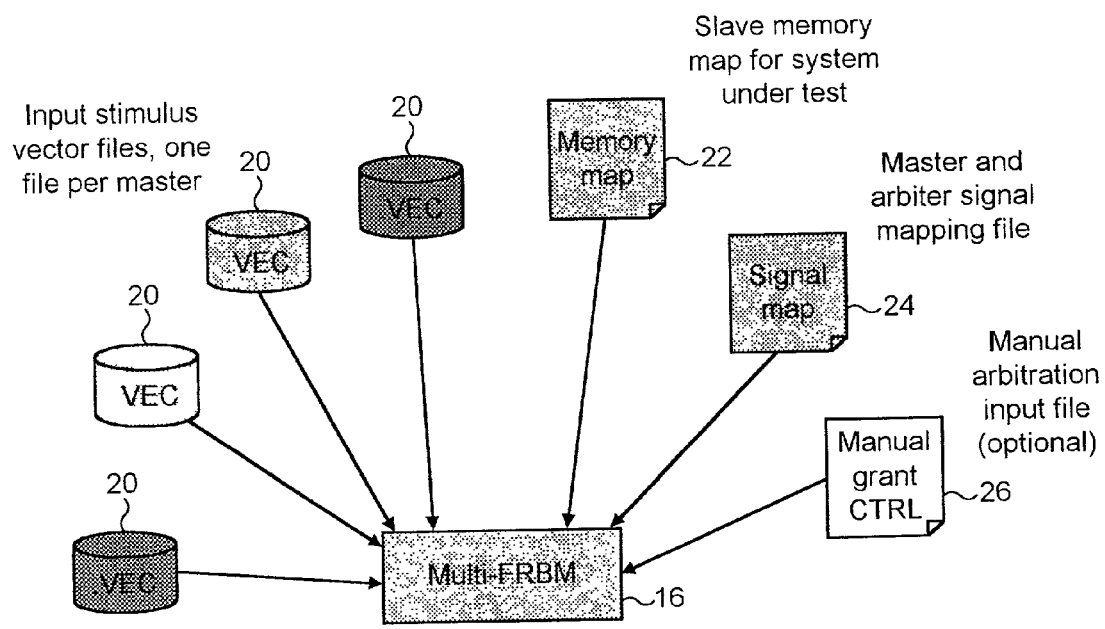
FIG. 3 schematically illustrates the data required to set up an emulation of multiple bus masters.

FIG. 3 schematically illustrates the input data needed to configure and control the emulation of multiple bus masters. In particular, a script of bus accesses to be performed by each bus master is provided in the form of a vector file 20. Each entry in such a vector file specifies a command that will trigger the bus master emulation concerned to perform a particular bus access or other action. In the example illustrated in FIG. 3, four bus masters are being driven by respective associated vector files. As previously mentioned, these separate vector files 20 will be concatenated into a single concatenated vector file (script) for later use by the multiple bus master emulator 16.

A memory map 22 is also provided as an input and specifies the memory addresses associated with respective bus slaves being emulated and addressed. This arrangement assumes that the bus slaves are memory mapped bus slaves.

A further input is a signal map 24 which specifies various static parameters used in the configuration of the multiple bus master emulation 16, e.g. file locations for script files, whether or not arbitration is to start in the automatic or manual mode, etc.

A final optional input is the manual arbitration input file 26. When manual arbitration is being provided, the manual arbitration input file 26 specifies which bus master will have priority. The file may also specify the switching points between automatic and manual arbitration to be used during the emulation.

FIG. 4 illustrates the manual arbitration input file 26 in more detail. In particular, the right hand column indicates which of the possible sixteen bus masters being emulated will have priority at a given time. The left hand column indicates a number of emulation cycles (bus access cycles) for which arbitration will be switched to automatic until a return is made to the manual arbitration as specified by the right hand column of the file.

FIG. 5 shows the memory map 22 for the bus slaves in more detail. The left hand two columns give the name of the slave device concerned as can be used in addressing that slave device with the bus master scripts. The right hand two columns specify the hexadecimal address range within the memory map for the bus slave device concerned.

The master and arbiter signal mapping file 24 has its form as illustrated below.

```
[arbiter]
MODE=manual       ; auto|manual
INTERNAL=true     ; true|false
INPUTGRANT=grant.vec
HGRANTx1=hgrantM1
HGRANTx2=hgrantM2
[shared]
HCLK=hclk         ; System in
HRESET=hreset     ;
HREADY=hready     ; Slave in
HRESP=hresp       ;
HRDATA=hrdata     ;
HTRANS=htrans     ; Master out
HADDR=haddr
HWRITE=hwrite
```

```
HSIZE=hsize
HBURST=hburst
HPROT=hprot
HWDATA=hwdata
// Define unique master signals
[master1]
HBUSREQx1=hbusreqM1
HLOCKx1=hlockM1
INPUTVEC=master1.vec
[master2]
HBUSREQx2=hbusreqM2
HLOCKx2=hlockM2
INPUTVEC=master2.vec
// Notes:
//
// [arbiter] section specifies
// type of arbitration required
// [shared] section specifies
// system inputs and outputs
// [masterx] section overrides
// shared signal names where
// required
```

This master and arbiter signal map input file 24 specifies static (or at least starting) control parameters associated with different portions of the multiple bus master emulation 16, namely arbiter parameters, shared bus parameters and respective bus master parameters.

Figure 6:
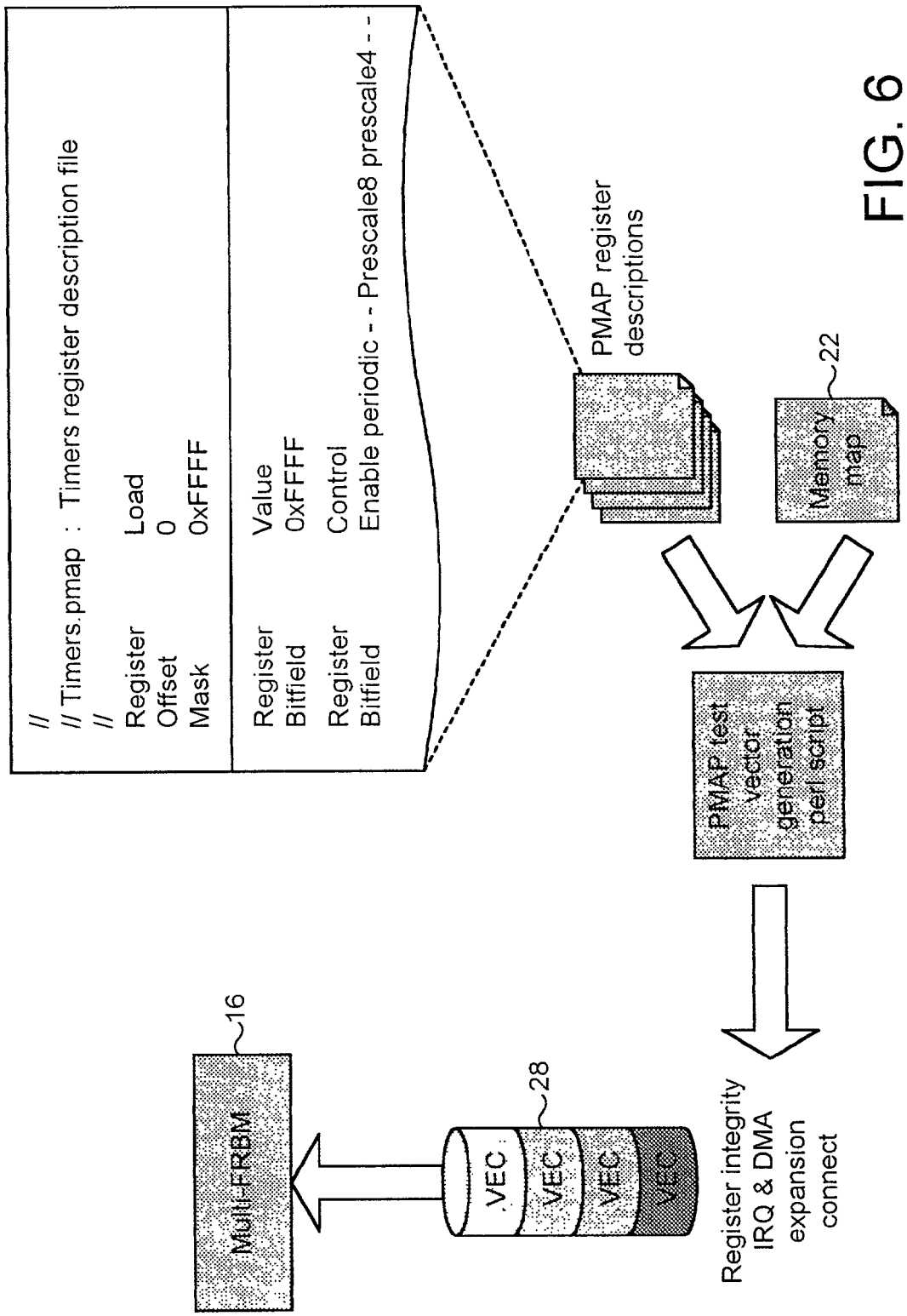
FIG. 6 illustrates the combination of the different types of input data used to generate a concatenated script for driving the bus master emulation.

FIG. 6 illustrates the inputs and processes used to generate the concatenated bus master script 28 used to control the multiple bus master emulation 16. The memory map 22 and register descriptions are then input to software that generates scripts of bus accesses to be performed by various emulated bus masters in order to test the system design concerned. The output of such software is a concatenated bus master script 28. The format of the input stimulus files that go on to form the bus master script is shown below, together with comments regarding its uses.

Command Set
    W   address   Data   [Size]   [Burst]   [Prot] [LOCK|RELEASE]
    R   address   Data   [Mask]   [Size]   Burst]   [Prot] [LOCK|RELEASE]
    S Data [Mask]
    B
    I   [Address]   [Dir]   [Size]   [Burst]   [Prot] [LOCK|RELEASE]
    P Address Data [Mask] [Size] [INCR|SINGLE] [Prot] [LOCK|RELEASE]
    L Number
    M   Num_cycles   [Addr_Low   Addr_High] [LOCK|RELEASE]
    "Simulation Comment"
Can be used to emulate multi-master activity
LOCK option ensures that the master is granted until RELEASE on next W,R,M or P command
Text format allows for automated generation or conversion from existing vector formats It will be noted in particular that the command set specified above includes parameters related to the bus access concerned as well as a flag indicating whether a particular command will lock or release the addressed bus slave. These lock and release flags are monitored by the arbiter 18 within the software emulation environment and used to determine whether a particular bus slave is blocked from access by other bus masters at a given point in time in order that that access to a particular bus slave may be granted or refused if a new bus access request is encountered.

Figure 7:
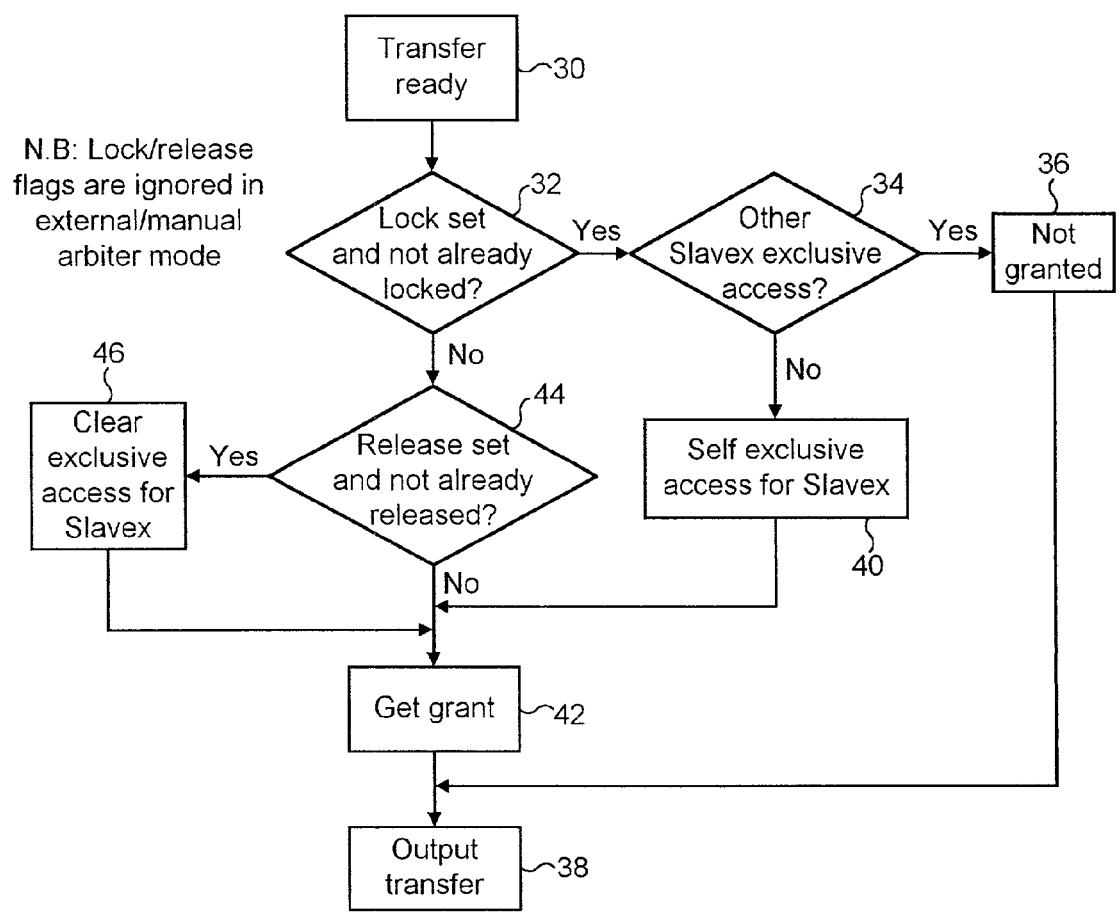
FIG. 7 is a flow diagram schematically illustrating the detection process applied to determine whether or not a bus access should be granted during the emulation.

FIG. 7 a flow diagram schematically illustrating the processing performed by the arbitration mechanism 18. At step 30, the system encounters a bus access request to be serviced. Step 32 determines whether or not the locked flag is set in the command relating to the bus access concerned. If the lock flag is set, then processing proceeds to step 34 at which a determination is made as to whether or not exclusive access has already been granted to that addressed bus slave for another bus master. If such exclusive access has already been granted, then step 36 rejects the access request and processing proceeds to step 38, at which the result is reported. If the test at step 34 indicated that exclusive access was not already granted to another bus master, then step 40 serves to grant exclusive access to the requesting bus master and record this within the arbiter 18 prior to proceeding to step 42 where the bus is granted to the access concerned and the transfer takes place between the bus master and bus slave.

If the determination at step 32 was that the lock flag was not set (or was already set in favour of the requesting bus master), then processing proceeds to step 44. Step 44 tests to see if the release flag is set in the command concerned (and the bus slave is not already released). If the release flag is set and the bus slave has not already been released, then processing proceeds to step 46 at which the bus slave is released before processing proceeds to step 42 in order to carry out the bus access concerned.

Figure 8:
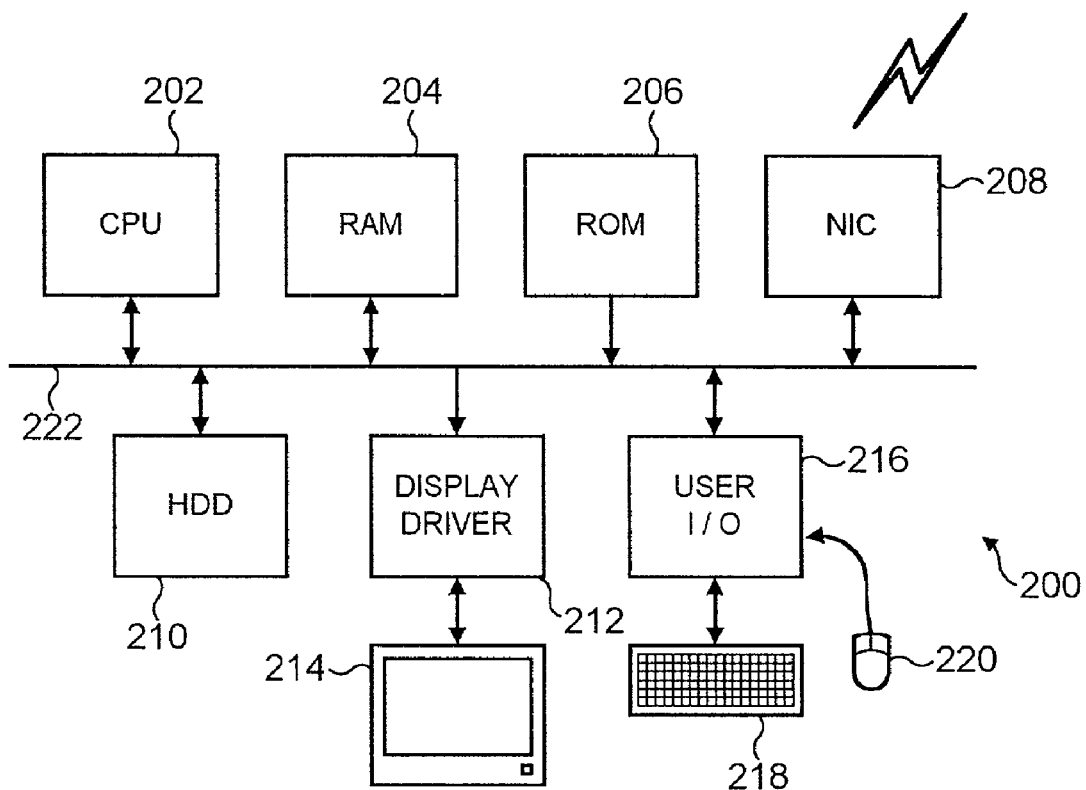
FIG. 8 is a diagram schematically illustrating the architecture of a general purpose computer of the type which may be used to implement the above described techniques.

FIG. 8 schematically illustrates a general purpose computer 200 of the type that may be used to implement the above described techniques. The general purpose computer 200 includes a central processing unit 202, a random access memory 204, a read only memory 206, a network interface card 208, a hard disk drive 210, a display driver 212 and monitor 214 and a user input/output circuit 216 with a keyboard 218 and mouse 220 all connected via a common bus 222. In operation the central processing unit 202 will execute computer program instructions that may be stored in one or more of the random access memory 204, the read only memory 206 and the hard disk drive 210 or dynamically downloaded via the network interface card 208. The results of the processing performed may be displayed to a user via the display driver 212 and the monitor 214. User inputs for controlling the operation of the general purpose computer 200 may be received via the user input output circuit 216 from the keyboard 218 or the mouse 220. It will be appreciated that the computer program could be written in a variety of different computer languages. The computer program may be stored and distributed on a recording medium or dynamically downloaded to the general purpose computer 200. When operating under control of an appropriate computer program, the general purpose computer 200 can perform the above described techniques and can be considered to form an apparatus for performing the above described technique. The architecture of the general purpose computer 200 could vary considerably and FIG. 8 is only one example.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A method of testing a design of a data processing circuit having a plurality of bus masters connected via a shared bus to at least one bus slave, said method comprising the steps of:
    emulating by simulation with computer software a first bus master issuing a first bus access request to make a data transfer via said shared bus to a bus slave being emulated by simulation with computer software;

emulating by simulation with computer software a second bus master issuing a second bus access request to make a data transfer via said shared bus to said bus slave;

detecting if said first bus master has blocked access to said bus slave prior to said second emulating step, wherein, if said first bus master being emulated has blocked access to said bus slave, then refusing said second bus access request and, if said first bus master being emulated has not blocked access to said bus slave, then granting said second bus access request; and generating test results indicative of expected operation of said data processing circuit design in dependence upon whether said second bus access request was refused or was granted.

2. A method as claimed in claim 1, wherein at least one of said bus masters being emulated is driven by a bus master script specifying data transfers to be emulated.

3. A method as claimed in claim 2, wherein said bus master script specifies that said bus slave is to be locked such that other bus access requests to said bus slave are blocked.

4. A method as claimed in claim 2, wherein said bus master script specifies that said bus slave is to be released such that other bus access requests to said bus slave are not blocked.

5. A method as claimed in claim 2, wherein a plurality of bus masters being emulated are driven by a concatenated bus master script.

6. A method as claimed in claim 1, further including the step of an external arbiter overriding said detection step and granting bus access requests using external arbitration rules.

7. A method as claimed in claim 6, wherein an emulation control script specifies emulated bus clock cycles at which said external arbiter overrides said detection step.

8. A method as claimed in claim 1, wherein emulation of one or more of said plurality of bus masters includes emulation of operational data processing in addition to emulation of data transfers via said shared bus.

9. A method as claimed in claim 1, wherein said shared bus is a multilayer shared bus.

10. Apparatus for testing a design of a data processing circuit having a plurality of bus masters connected via a shared bus to at least one bus slave, said apparatus comprising:

a first emulator operable to emulate by simulation with computer software a first bus master issuing a first bus access request to make a data transfer via said shared bus to a bus slave being emulated by simulation with computer software;

a second emulator operable to emulate by simulation with computer software a second bus master issuing a second bus access request to make a data transfer via said shared bus to said bus slave;

a detector operable to detect if said first bus master has blocked access to said bus slave, wherein if said first bus master has blocked access to said bus slave prior to said second bus access request, then said second bus access request is refused, and if said first bus master has not blocked access to said bus slave, then said second bus access request is granted; and a display for displaying detector results indicative of expected operation of said data processing circuit in dependence upon whether said second bus access request was refused or was granted.

11. Apparatus as claimed in claim 10, wherein at least one of said bus masters being emulated is driven by a bus master script specifying data transfers to be emulated.

12. Apparatus as claimed in claim 11, wherein said bus master script specifies that said bus slave is to be locked such that other bus access requests to said bus slave are blocked.

13. Apparatus as claimed in claim 11, wherein said bus master script specifies that said bus slave is to be released such that other bus access requests to said bus slave are not blocked.

14. Apparatus as claimed in claim 11, wherein a plurality of bus masters being emulated are driven by a concatenated bus master script.

15. Apparatus as claimed in claim 10, wherein an external arbiter overrides said detection step and grants bus access requests using external arbitration rules.

16. Apparatus as claimed in claim 15, wherein an emulation control script specifies emulated bus clock cycles at which said external arbiter overrides said detection step.

17. Apparatus as claimed in claim 10, wherein emulation of one or more of said plurality of bus masters includes emulation of operational data processing in addition to emulation of data transfers via said shared bus.

18. Apparatus as claimed in claim 10, wherein said shared bus is a multilayer shared bus.

* * * * *